US006369454B1

United States Patent
Chung

(10) Patent No.: US 6,369,454 B1
(45) Date of Patent: Apr. 9, 2002

(54) SEMICONDUCTOR PACKAGE AND METHOD FOR FABRICATING THE SAME

(75) Inventor: JiYoung Chung, Kyeong-gi Do (KR)

(73) Assignees: Amkor Technology, Inc., Chandler, AZ (US); Anam Semiconductor Inc., Seoul (KR)

(*) Notice: Subject to any disclaimer, the term of this patent is extended or adjusted under 35 U.S.C. 154(b) by 0 days.

(21) Appl. No.: 09/461,523

(22) Filed: Dec. 14, 1999

(30) Foreign Application Priority Data

Dec. 31, 1998 (KR) ............................................. 98-63822

(51) Int. Cl.[7] ....................... H01L 23/48; H01L 23/52; H01L 29/40
(52) U.S. Cl. .................. 257/787; 257/781; 257/784; 257/786; 257/723
(58) Field of Search ........................ 257/787, 780, 257/781, 784, 786, 666, 723

(56) References Cited

U.S. PATENT DOCUMENTS

| | | | | |
|---|---|---|---|---|
| 5,856,915 A | * | 1/1999 | Weinberg | 361/790 |
| 5,866,952 A | * | 2/1999 | Wojnarowski et al. | 257/788 |
| 5,869,905 A | * | 2/1999 | Takebe | 257/787 |
| 5,973,263 A | * | 10/1999 | Tuttle et al. | 174/52.2 |
| 5,987,739 A | * | 11/1999 | Lake | 29/841 |
| 6,072,239 A | * | 6/2000 | Yoneda et al. | 257/730 |
| 6,197,616 B1 | * | 3/2001 | Hyoudo et al. | 438/113 |
| 6,294,100 B1 | * | 9/2001 | Fan et al. | 216/14 |
| 6,309,909 B1 | * | 10/2001 | Ohgiyama | 438/112 |

* cited by examiner

Primary Examiner—Jhihan B Clark
(74) Attorney, Agent, or Firm—Skjerven Morrill MacPherson LLP; James E. Parsons

(57) ABSTRACT

A semiconductor package and a method of making the package are disclosed. The package includes a semiconductor chip having first surface with a conductive pad thereon. A first end of a bond wire is connected to each of the pads. Encapsulant covers the fist surface of the chip, the pads, and the bond wires, and forms side surfaces of the package. A second end of the bond wires is exposed at a side surface of the package. Making the package includes providing a wafer including a plurality of semiconductor chip units. Each chip unit has a plurality of conductive pads at a first surface of the wafer. A bond wire is electrically connected between each pad of each semiconductor chip unit and a pad of at least one adjacent semiconductor chip unit of the wafer. An encapsulant is applied onto the first surface of the wafer so as to completely cover the bond wires and pads of the semiconductor units. The encapsulated wafer is separated between adjacent semiconductor chip units so as to sever the bond wires and form individual packages each having side surfaces formed of the encapsulant. A severed end of each bond wire is exposed at a side surface of the respective package.

25 Claims, 8 Drawing Sheets

FIG.1A    —PRIOR ART—
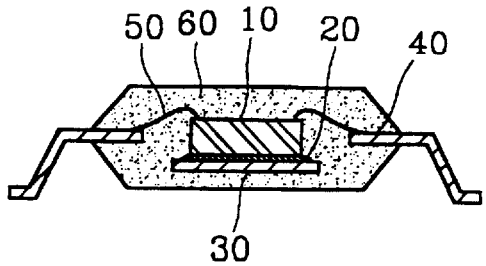
FIG.1B    —PRIOR ART—
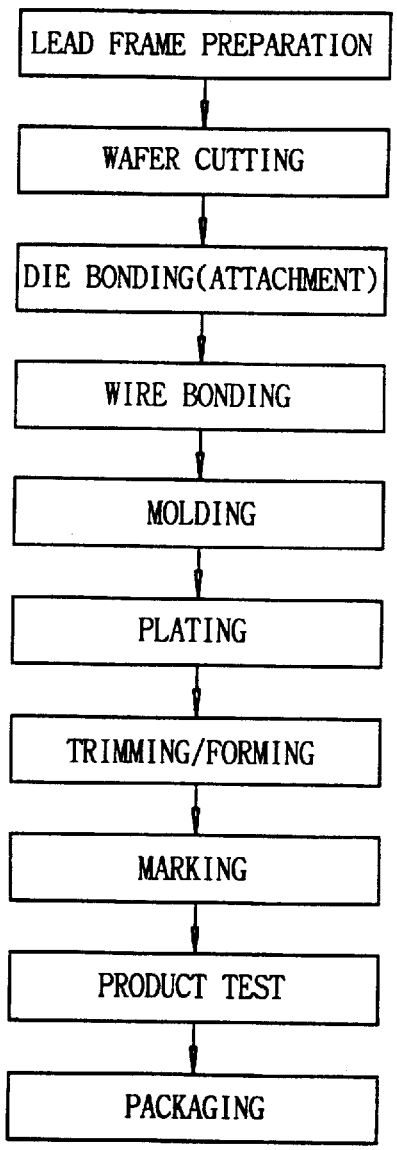

SEMICONDUCTOR PACKAGE AND METHOD FOR FABRICATING THE SAME

BACKGROUND OF THE INVENTION

1. Field of the Invention

The present invention relates to a chip size semiconductor package and a method for fabricating such a chip size semiconductor package. More particularly, the present invention relates to a chip size semiconductor package having a thin structure fabricated by interconnecting at least two adjacent semiconductor chip units of a wafer including a plurality of semiconductor chip units by use of bonding wires, molding encapsulates on the upper surface of the wafer to completely encapsulate the bonding wires, conducting a singulation process for the wafer in such a fashion that cut ends of the bonding wires formed during the singulation process are exposed at one or more side surfaces of the encapsulate encapsulating those bonding wires. The present invention also relates to a method for fabricating this chip size semiconductor package.

2. Description of the Prior Art

Generally, semiconductor packages are classified into a variety of types in accordance with the structures thereof. In particular, semiconductor packages are classified into an in-line type and a surface mount type in accordance with the mounting structures thereof. For representative in-line type semiconductor packages, there are a dual in-line package (DIP) and a pin grid array (PGA) package. For representative surface mount type semiconductor packages, there are a quad flat package (QFP) and a ball grid array (BGA) package.

Recently, use of surface mount type semiconductor packages has increased, as compared to in-line type semiconductor packages, in order to obtain an increased element mounting density of a printed circuit board meeting a compactness or miniature of electronic appliances. A representative example of such surface mount type semiconductor packages will be described in conjunction with FIGS. 1A and 1B.

Referring to FIG. 1A, a conventional surface mount type semiconductor package is illustrated. As shown in FIG. 1A, the conventional semiconductor package includes a semiconductor chip 10 with integrated electronic circuits, a mounting plate 30 for mounting the semiconductor chip 10 thereon by means of an adhesive layer 20 interposed therebetween, a plurality of leads 40 for externally transmitting signals from the semiconductor chip 10, bonding wires 50 for interconnecting the semiconductor chip 10 with the leads 40, and an encapsulate 60 for encapsulating the semiconductor chip and other elements of the semiconductor package, thereby protecting those elements from mechanically, electrically, and chemically harmful environments.

Referring to FIG. 1B, a method for fabricating the conventional semiconductor package having the above mentioned configuration is illustrated. This method involves a lead frame preparation step for preparing a lead frame (not shown) integrally formed with the paddle 30 and leads 40, a semiconductor chip mounting step for forming the adhesive layer 20 on the paddle 30 of the lead frame, and attaching the semiconductor chip 10 to the paddle 30, a wire bonding step for connecting the semiconductor chip 10 to the leads 40 of the lead frame by means of electrically conductive wires 50, an encapsulating step for molding an encapsulate resin to form an encapsulate adapted to encapsulate the semiconductor chip 10 and conductive wires 50, a plating step for plating portions of the leads 40 outwardly exposed from the encapsulate 60, and a trimming and forming step for bending and cutting the leads 40 into a desired shape.

The above mentioned conventional semiconductor package has a size considerably larger than that of the semiconductor chip used. For this reason, this semiconductor package cannot meet the recent demand for a light, thin, simple, miniature structure. There is also a limitation in increasing the number of output terminals. This is because there is a limitation in reducing the lead width and the pitch of adjacent leads. For this reason, the conventional semiconductor package has a relatively small number of output terminals. As a result, it is impossible for the conventional semiconductor package to meet the recent demand for a highly integrated miniature structure. Furthermore, the fabrication method used to fabricate the conventional semiconductor package involves a relatively large number of processes. For this reason, there is a limitation in reducing the costs through use of simplified processes.

SUMMARY OF THE INVENTION

Therefore, a first object of the invention is to provide a chip size semiconductor package having a simple and thin structure including an increased number of output terminals.

A second object of the invention is to provide a chip size semiconductor package assembly including a plurality of chip size semiconductor packages assembled in the form of a wafer, which has a simple and thin structure including an increased number of output terminals.

A third object of the invention is to provide a method for fabricating a chip size semiconductor package having a thin structure, which is capable of simplifying the processes used, thereby reducing the costs.

The first object of the present invention is accomplished by providing a chip size semiconductor package comprising a semiconductor chip having a plurality of pads, bonding wires each bonded at one-side end thereof to an associated one of the pads of the semiconductor chip, and an encapsulate for encapsulating the bonding wires and an upper surface of the semiconductor chip, wherein: the other-side ends of the bonding wires are exposed at one or more side surfaces of the encapsulate so that they serve as output terminals, respectively.

The second object of the present invention is accomplished by providing a chip size semiconductor package assembly comprising: a wafer including a plurality of semiconductor chip units each having a plurality of pads; bonding wires for electrically connecting the pads of each of the semiconductor chip units to the pads of at least one of the semiconductor chip units arranged adjacent to the semiconductor chip unit; and encapsulates for encapsulating the bonding wires and an upper surface of the wafer.

The third object of the present invention is accomplished by providing A method for fabricating a chip size semiconductor package comprising the steps of: a wire bonding step for interconnecting at least two adjacent semiconductor chip units of a wafer including a plurality of semiconductor chip units by use of bonding wires, respectively; an encapsulate molding step for molding encapsulates on an upper surface of the wafer, on which the adjacent semiconductor chip units are interconnected by the bonding wires, in such a fashion that the bonding wires are completely encapsulated; and a singulation step for cutting the encapsulate-molded wafer into the individual semiconductor chip units in such a fashion that each of the bonding wires has two cut ends each exposed at a side surface of an associated one of the encapsulates under the condition in which the cut ends of the bonding wires encapsulated in each of the encapsulates are exposed at one or more side surface of the encapsulate.

BRIEF DESCRIPTION OF THE DRAWINGS

The above objects, and other features and advantages of the present invention will become more apparent after a reading of the following detailed description when taken in conjunction with the drawings, in which:

FIG. 1A is a cross-sectional view illustrating a conventional surface mount type semiconductor package;

FIG. 1B is a flow chart illustrating a method for fabricating the conventional surface mount type semiconductor package of FIG. 1A;

DESCRIPTION OF THE PREFERRED EMBODIMENTS

Figure 2:
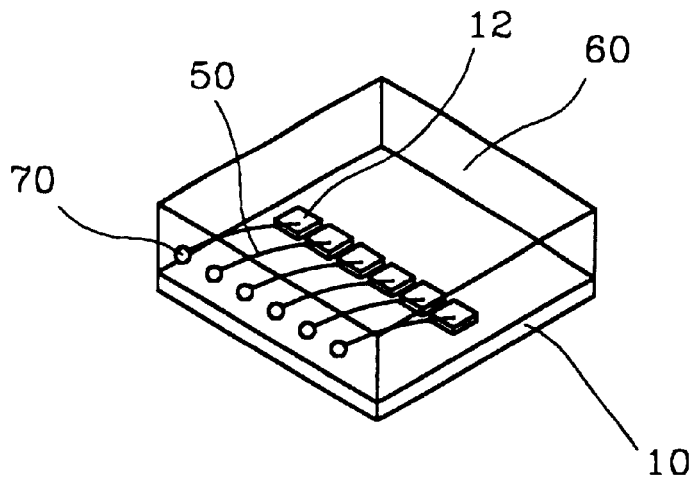
FIG. 2 is a perspective view schematically illustrating a chip size semiconductor package according to a first embodiment of the present invention.

FIG. 2 is a perspective view schematically illustrating a chip size semiconductor package according to a first embodiment of the present invention. As shown in FIG. 2, the semiconductor package includes a semiconductor chip 10 at an exterior surface thereof. A first upper surface of the semiconductor chip 10 internal to the package includes a plurality of pads 12, and an opposite second lower surface of semiconductor chip 10 forms an exterior surface of the package. A plurality of conductive wires 50 are each bonded at one-side end thereof to an associated one of the pads 12 of the semiconductor chip 10 An encapsulate 60 encapsulates the conductive wires 50 and the upper surface of the semiconductor chip 10 while allowing the other-side ends of the conductive wires 50 to be exposed at one or more side surfaces of the package formed by encapsulant 60 above the upper surface of semiconductor chip 10. The other-side ends of the conductive wires 50, which are exposed at one or more side surfaces of the encapsulate 60, are used as output terminals. Alternatively, electrically conductive solder balls or planar leads, which are made of a lead/tin alloy, may be brazed, as output terminals, to respective other-side ends of the conductive wires 50. The solder balls are denoted by the reference numeral 72 in FIG. 10A whereas the planar leads are denoted by the reference numeral 72 in FIG. 10B. In the case of FIG. 2, the pads 12 of the semiconductor chip 10 are arranged in a single line on the upper surface of the semiconductor chip 10. In this case, the conductive wires 50, which are bonding wires, are exposed at only one side surface of the encapsulate 60.

Figure 3A:
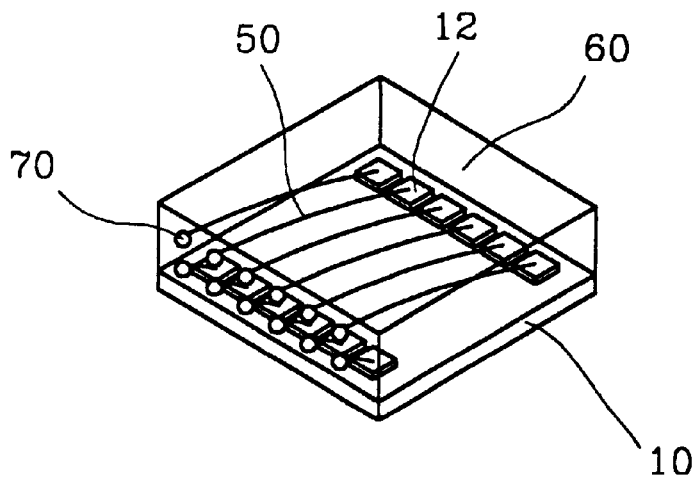
FIGS. 3A to 3C are perspective views respectively illustrating chip size semiconductor packages according to second through fourth embodiments of the present invention.
Figure 3B:
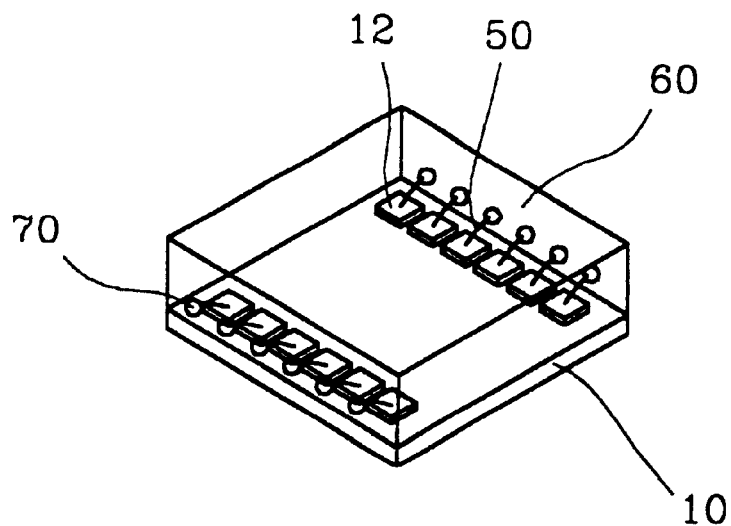
Figure 3C:
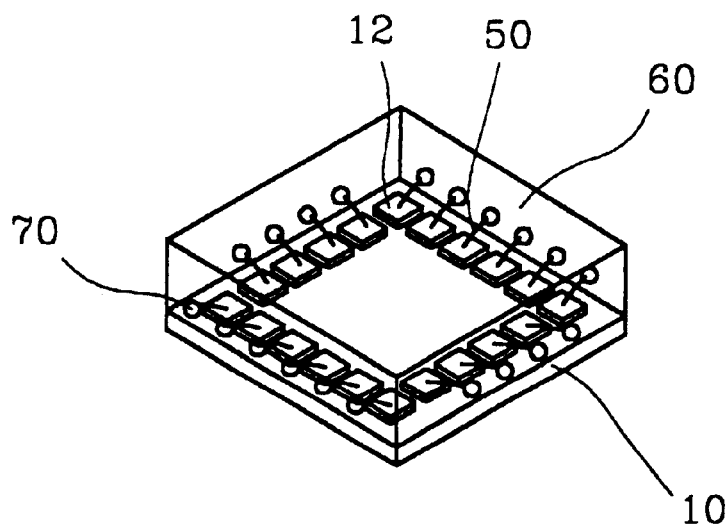

FIGS. 3A to 3C are perspective views respectively illustrating chip size semiconductor packages according to second through fourth embodiments of the present invention.

Referring to FIG. 3A, the pads 12 formed at the semiconductor chip 10 are arranged in two parallel lines in such a fashion that those of one line face those of the other line, respectively. In this case, the conductive wires 50, which are connected at one-side ends thereof to respective pads 12, are exposed at only one side surface of the encapsulate 60. The conductive wires 50 bonded to the pads 12 of the pad line arranged near the wire-exposing side surface of the encapsulate 60 are arranged in such a fashion that their exposed other-side ends are positioned at a low level whereas the conductive wires 50 bonded to the pads 12 of the pad line arranged away from the wire-exposing side surface of the encapsulate 60 are arranged in such a fashion that their exposed other-side ends are positioned at a higher level.

That is, the other-side ends of the pads 12 are exposed in two lines of different levels at one surface of the encapsulate 60. By virtue of such an arrangement, it is possible to increase the distance (pitch) between adjacent ones of the output terminals 70. In this case, the above mentioned metal balls or leads may be formed at the exposed other-side ends of the conductive wires 50, respectively.

Although the other-side ends of the conductive wires 50 serving as output terminals 70 are exposed at only one side surface of the encapsulate 60, as shown in FIG. 3A, the present invention is not limited to this configuration. In the case of FIG. 3B, the other-side ends of the conductive wires 50 serving as output terminals 70 are exposed at two opposite side surfaces of the encapsulate 60. For example, where the semiconductor package includes an increased number of pads 12 arranged in two lines, it is possible to arrange the conductive wires 50 in such a fashion that the other-side ends of the conductive wires 50 extending from the pads 12 included in the same pad line are arranged at two different levels in an alternate fashion. In this case, the other-side ends of the conductive wires 50 extending from each pad line may also be exposed at the side surface of the encapsulate 60 positioned near the pad line. This configuration is a combination of the configuration shown in FIG. 3B and the configuration shown in FIG. 4. Of course, this combined configuration is optional in accordance with the present invention. Where the pads 12 of the semiconductor package are arranged in four lines forming a square or rectangular shape, a configuration may be used in which the other-side ends of the conductive wires 50 extending from each pad line are exposed at the side surface of the encapsulate 60 positioned near the pad line. In other words, the other-side ends of the conductive wires 50 are exposed at all the four side surfaces of the encapsulate 60. This configuration is also optional in accordance with the present invention. Also, the other-side ends of the conductive wires 50 exposed at each side surface of the encapsulate 60 may be arranged at two or more different levels.

Figure 4:
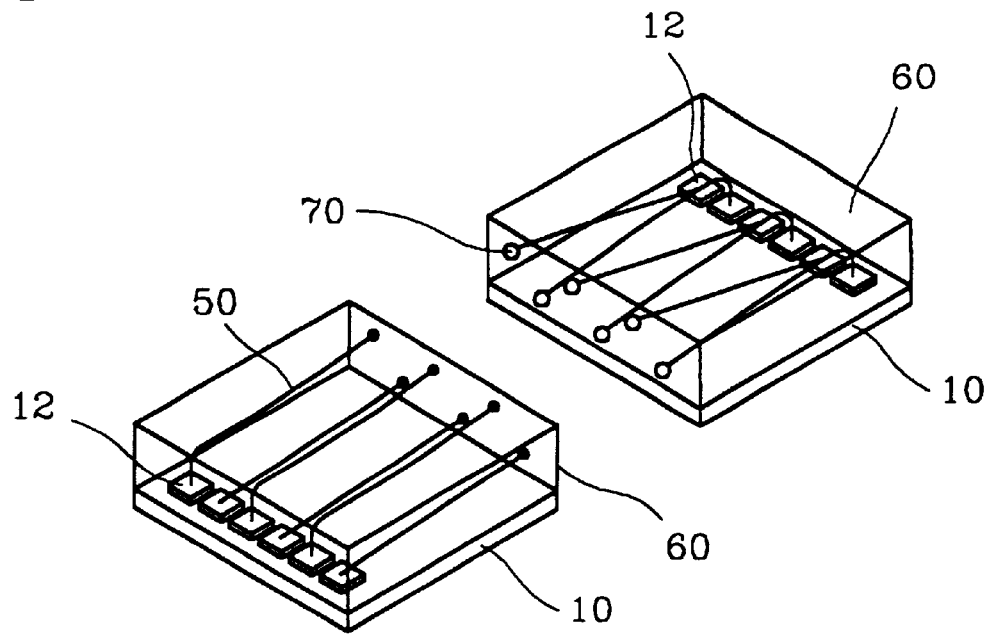
FIG. 4 is a perspective view schematically illustrating a chip size semiconductor package according to a fifth embodiment of the present invention.

FIG. 4 is a perspective view schematically illustrating a chip size semiconductor package according to a fifth embodiment of the present invention. In accordance with this embodiment, where the pads 12 of the semiconductor chip 10 are arranged in one line, the conductive wires 50 bonded at one-side ends thereof to the pads 12 are arranged in such a fashion that the other-side ends thereof are positioned at two different levels in an alternate fashion. That is, the other-side ends of the conductive wires 50 are arranged in two lines of different levels in a zig-zag fashion. By virtue of this arrangement, it is possible to increase the distance (pitch) between adjacent ones of the other-side ends of the conductive wires 50 exposed at one side surface of the encapsulate 60.

Of course, where the pads 12 of the semiconductor chip 10 are arranged in two lines, the other-side ends of the conductive wires extending from each pad line, while being exposed at one side surface of the encapsulate 60, can be arranged in two or more lines of different levels by appropriately adjusting those levels.

Also, the lines of the exposed other-side ends of the conductive wires 50 can have various shapes, for example, an orthogonal shape, a zig-zag shape, or other irregular shapes. The line shape of the exposed other-side ends of the conductive wires 50 can be optionally determined by a variety of parameters including the number and arrangement of pads on the semiconductor chip 10, the efficiency of the process used in the fabrication of the semiconductor package, the conditions required for a banding machine used, and the using condition of the semiconductor package.

Preferably, the conductive wires 50 are made of a material exhibiting a superior electrical conductivity, for example, aluminum, gold, silver, or an alloy thereof. The conductive wires 50 preferably have a diameter of 1 to 50 mil (one mil corresponds to $1/1,000$ inch). In order to easily form metal balls or leads, as output terminals 70, on the other-side ends of the conductive wires 50, it is preferred for the diameter of the conductive wires 50 to be ranged from 3 mil to 20 mil. Preferably, the encapsulate 60 encapsulates the entire portion of each conductive wire 50 except for the other-side end thereof. The encapsulate 60 can be made of a resin-based material which is conventionally used in the technical field to which the present invention pertains. An epoxy molding resin may be mainly used.

Figure 5:
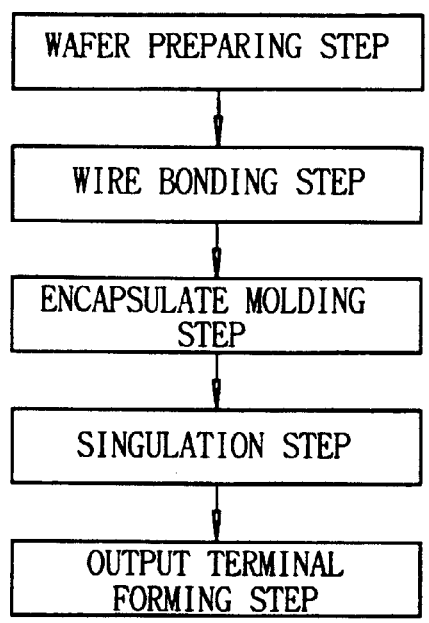
FIG. 5 is a flow chart illustrating sequential steps of a fabrication method for a chip size semiconductor package according to the present invention.
Figure 6:
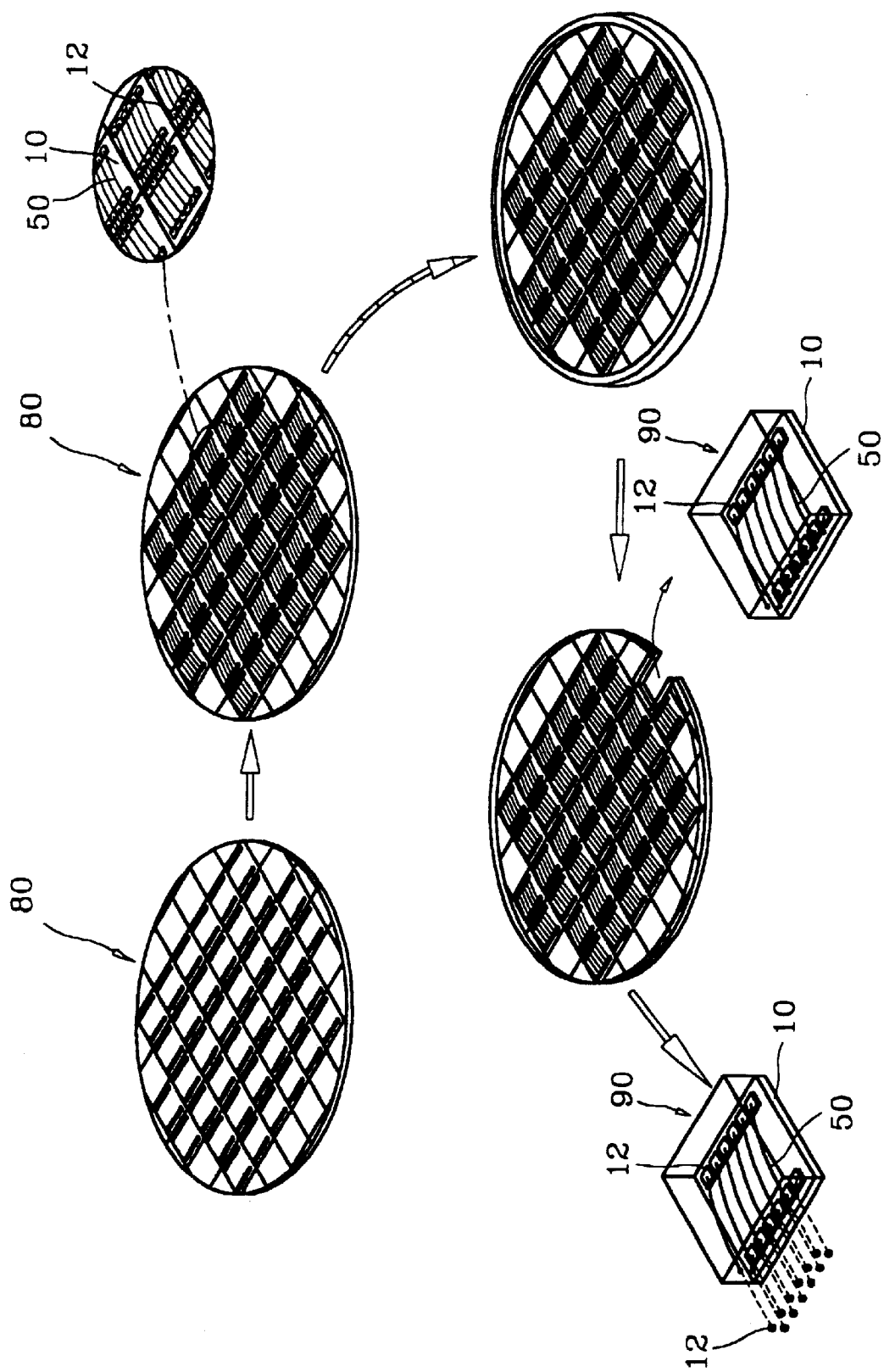
FIG. 6 is a schematic perspective view illustrating the sequential steps of the fabrication method for the chip size semiconductor package according to the present invention.

Now, a method for fabricating a chip size semiconductor package having the above mentioned configuration in accordance with the present invention will be described. FIG. 5 is a flow chart illustrating sequential steps of the fabrication method for the chip size semiconductor package according to the present invention. FIG. 6 is a schematic perspective view illustrating the sequential steps of the fabrication method for the chip size semiconductor package according to the present invention. For the convenience of description, the following description will be made while simultaneously referring to both FIGS. 5 and 6.

In accordance with the illustrated method, a wafer 80 is first prepared which has a plurality of integrated semiconductor chip units 10 each including an integrated circuit and a plurality of pads 12. Typically, the wafer has a substantially circular shape. Circuit patterns (integrated circuits) are formed on the wafer 80. The size and shape of the semiconductor chip units 10 depend on the kind and shape of the circuit patterns. Since the semiconductor chip units 10 have a square or rectangular shape, no semiconductor chip unit is formed at the circumferential portion of the wafer 80. As mentioned above, a plurality of pads 12 are formed on each semiconductor chip unit 10. On each semiconductor chip unit 10, the pads 12 may be centrally arranged along a single line. The pads 12 may also be arranged in two lines near two opposite sides of the semiconductor chip unit 10. Alternatively, the pads 12 may be arranged in the form of a square or rectangular shape along four lines near four sides of the semiconductor chip unit 10. Although each pad 12 may have an optional shape, it typically has a square or rectangular shape.

In accordance with the present invention, the number and arrangement of the pads 12 are not limiting factors, but selective factors. Typically, the pads 12 are arranged in a single line, in two facing lines, or in four lines respectively corresponding to four sides of a square or rectangular shape.

After the preparation of the wafer 80, a wire bonding step is conducted. At the wire bonding step, the pads 12 of each semiconductor chip unit 10 on the wafer 80 are connected to the pads 12 of one or more semiconductor chip units 10 adjacent thereto using bonding wires 50, respectively.

In the illustrated case, each semiconductor chip unit 10 is wire-bonded to only one of four semiconductor chip units 10 adjacent thereto using bonding wires 50. That is, the wire bonding step is conducted for every two adjacent semiconductor chip units 10. However, the wire bonding step may be conducted in such a fashion that each semiconductor chip unit 10 is wire-bonded to two semiconductor chip units 10 arranged adjacent thereto at opposite sides thereof, respectively. Alternatively, the wire bonding step may be carried out in such a fashion that each semiconductor chip unit 10 is wire-bonded to four semiconductor chip units 10 arranged adjacent thereto at four sides thereof, respectively. Furthermore, an optional combination of the above mentioned different wire bonding steps may be used. This will be readily appreciated by those skilled in the art.

The wire bonding step will now be described in detail, in conjunction with the case illustrated in FIG. 6. The wire bonding step is conducted for the semiconductor chip units 10 arranged in a matrix array on the wafer 80 in such a fashion that each semiconductor chip unit 10 is wire-bonded to only one of four semiconductor chip units 10 adjacent thereto. That is, every two adjacent semiconductor chip units 10 respectively included in the first and second columns of the matrix array are bonded to each other using bonding wires 50. Every two adjacent semiconductor chip units 10 respectively included in the third and fourth columns of the matrix array are bonded to each other using bonding wires 50. Thereafter, the wire bonding step is repeatedly carried out for the fifth and sixth columns, and then for the remaining column pairs of the matrix array. The order of conducting the wire bonding step is not limited to the above mentioned order. This order may be optionally determined, depending on the wire bonding conditions given. The wire bonding step may also be conducted in an alternate fashion between the columns and the rows.

Where the pads 12 of each semiconductor chip unit 10 are arranged in a single line, the wire bonding step can be simply achieved by wire-bonding the adjacent pads of adjacent semiconductor chip units 10 to each other. However, where the pads 12 of each semiconductor chip unit 10 are arranged in two or more lines, it may be desirable for the wire bonding step to be achieved by first wire-bonding together the pads 12 of adjacent semiconductor chip units 10 arranged adjacent to a singulation line, namely, the boundary line between the adjacent semiconductor chip units 10 using bonding wires 50, and then wire-bonding together the pads 12 of the adjacent semiconductor chip units 10 arranged away from the singulation line using bonding wires 50 in such a fashion that the bonding wires 50 are arranged in two or more lines of different levels in a vertical plane extending through the singulation line. This arrangement, in which the bonding wires 50 are arranged in two or more lines of different levels, is desirable in that the distance (pitch) between adjacent ones of the bonding wires 50 in the vertical line, which corresponds to one side surface of an encapsulate 60 to be subsequently formed, increases.

FIG. 3A best shows the arrangement in which the bonding wires 50 exposed at one side surface of the encapsulate 60 are arrange in two lines of different levels. The levels of the bonding wires 50 can be adjusted using a conventional wire bonding machine as it is.

The wire bonding step can be achieved using a ball-stitch bonding process or a ball-ball bonding process conventionally used in the technical field to which the present invention pertains.

Figure 7:
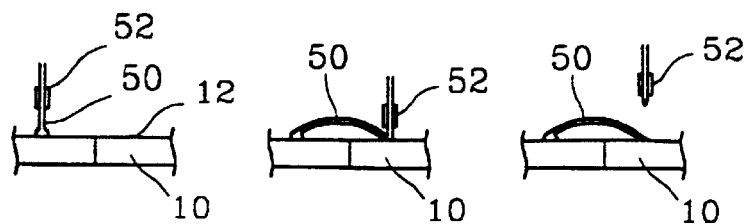
FIG. 7 is a schematic view illustrating sequential steps of a ball-stitch bonding process used in the fabrication method for the chip size semiconductor package according to the present invention.
Figure 8:
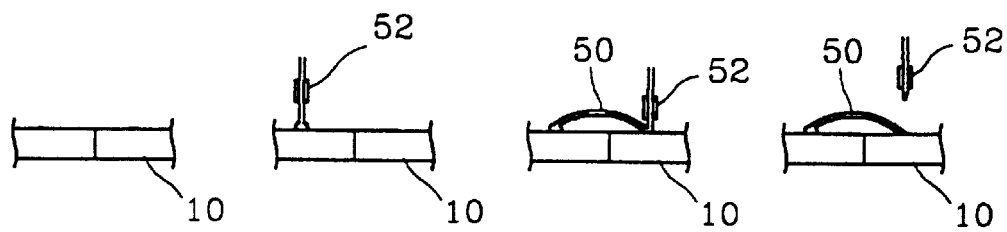
FIG. 8 is a schematic view illustrating sequential steps of a ball-ball bonding process used in the fabrication method for the chip size semiconductor package according to the present invention.

FIG. 7 is a schematic view illustrating sequential steps of the ball-stitch bonding process. FIG. 8 is a schematic view illustrating sequential steps of the ball-ball bonding process. These processes will now be described in brief in conjunction with FIGS. 7 and 8, respectively.

The ball-stitch bonding process applicable to the present invention is a bonding technique conventionally used in the technical field to which the present invention pertains. In accordance with this ball-stitch bonding process, a bonding wire 50 is first melted at one end thereof arranged at a first bonding position by use of a capillary 52, thereby forming a ball at the end of the bonding wire 50. Using the ball, the end of the bonding wire 50 is bonded to the first bonding position. Thereafter, the capillary 52 is moved from the first bonding position to the second bonding position. At the second bonding position, the capillary 52 depresses and melts the other end of the wire 50, thereby causing the other end of the wire 50 to be bonded to the second bonding position. On the other hand, in accordance with the ball-ball bonding process, a ball is first formed at the second bonding position. Thereafter, the bonding wire 50 is ball-bonded to the first bonding position in the same manner as that in the ball-stitch bonding process. The capillary 52 is then moved from the first bonding position to the second bonding position previously formed with the ball. At the second bonding position, the capillary 52 depresses the other end of the wire 50 against the ball, thereby causing the other end of the wire 50 to be bonded to the second bonding position.

In accordance with the present invention, the ball-ball bonding process is preferred. Of course, the ball-stitch bonding process may be used. In the latter case, an enhanced bonding speed is obtained.

Although the ball-stitch bonding process exhibits a superior processability by virtue of its enhanced bonding speed, it involves a possibility for the semiconductor chip units 10 to be damaged in that the capillary 52 adapted to guide the bonding wires 50 comes into direct contact with the pads 12 of the semiconductor chip units 10, thereby applying contact impact to the semiconductor chip units 10. In the case of the ball-ball bonding process, a slightly degraded processability is exhibited. In this case, however, there is no or little possibility for the semiconductor chip units 10 to be damaged in that the wire bonding is carried out under the condition in which a ball is previously formed at the second bonding position. In the ball-ball bonding process, an improvement in bonding force is also obtained.

After completion of the wire bonding step, an encapsulate molding step is carried out. In the encapsulate molding step, an encapsulating resin is molded on the upper surface of the wafer 80, in a state in which the semiconductor chip units 10 are wire-bonded using the bonding wires 50, so that the entire portion of each bonding wire 50 is completely encapsulated.

The encapsulate molding step may be achieved using a transfer molding process using a mold. In accordance with the transfer molding process, the wafer 80, for which the wire bonding step has been completely conducted, is first loaded in a lower mold (not shown) having a cavity having the same size as the wafer 80. Thereafter, an upper mold is coupled to the lower mold. For the upper mold, a mold is preferably used which is provided with scribing line forming protrusions for defining small cavities each adapted to mold an encapsulate for each semiconductor chip unit. A melted encapsulate resin is then injected into the cavity through a mold runner. Finally, the molded encapsulate resin is solidified. Alternatively, the encapsulate molding step may also be achieved using a liquid dispense process. In accordance with this dispense process, the wafer 80, for which the wire bonding step has been completely conducted, is first seated on a die (not shown). Thereafter, resin overflow preventing dams are formed along the circumferential edge of the wafer 80. A liquid encapsulate resin is then downwardly dispensed onto the wafer 80 using a dispenser such as a cylinder or tube.

During the encapsulate molding step for forming encapsulates 60, the bonding wires 50 may be slightly shifted in position due to an injection pressure of the melted encapsulate resin kept at high temperature and pressure. However, this problem is negligible in so far as the bonding wires 50 have a thickness of 3 mil or more. Typically, there is no problem when the bonding wires are made of gold or a gold alloy (e.g., 1% palladium) and have a thickness of 1.3 mil or more. Where a copper or aluminum-based alloy is used for the bonding wires 50, a further reduced wire thickness may be used.

For the material of the encapsulates 60, an epoxy-based molding resin may be used which is conventionally used in the technical field to which the present invention pertains.

After completion of the encapsulate molding step, a singulation step is carried out. In the singulation step, the molded wafer 80 is cut into individual semiconductor chip units 10, each having one encapsulate 60, in such a fashion that respective ends of the bonding wires 50 for each semiconductor chip unit 10 formed after the cutting are exposed at one or more side surfaces of the encapsulate 60 of the semiconductor chip unit 10.

The cutting conducted in the singulation step may be achieved using a wafer cutting blade or a laser beam which is conventionally used in the technical field to which the present invention pertains.

Figure 9:
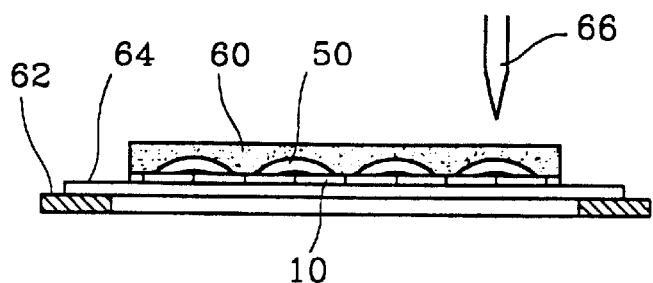
FIG. 9 is a cross-sectional view of a wafer formed with encapsulates, illustrating a singulation step for cutting the wafer into chip size semiconductor packages in accordance with the present invention.

FIG. 9 is a cross-sectional view of the wafer formed with encapsulates, illustrating the singulation step for cutting the wafer into chip size semiconductor packages in accordance with the present invention. As shown in FIG. 9, in the singulation step, an adhesive means 64 such as an adhesive tape is attached to a metal frame 62. The wafer 80 formed with the encapsulates 60 is then attached to the metal frame 62 while interposing the adhesive means 64 therebetween. The wafer 80 is then cut using a blade 66 in such a fashion that each bonding wire 50 is accurately cut at its central portion, so that it is separated into individual semiconductor packages. The cutting is conducted in such a fashion that the adhesive means 64 is incompletely cut in a thickness direction. That is, the adhesive means 64 is cut to a depth corresponding to about half the thickness thereof so that the completely separated semiconductor packages are integrally held on the adhesive means 64. The individual semiconductor packages are then picked up by a separate pick-up means (not shown).

After completion of the above mentioned processing steps, chip size semiconductor packages according to the present invention are obtained. In each chip size semiconductor package obtained after the singulation step, cut ends of the wires 50 are exposed at one or more side surfaces of the chip size semiconductor package. These cut ends of the wires 50 may be directly connected to a mother board (not shown).

On the other hand, for easy transportation and storage, the wafer subjected to the wire bonding step and resin encapsulate molding step may be shipped or stored prior to the singulation step, and then subsequently the packages may be singulated from the encapsulated wafer.

In accordance with the above mentioned fabrication method of the present invention, each chip size semiconductor package obtained after the singulation step is configured in such a fashion that the cut ends of the wires 50 are exposed at one or more side surfaces of the chip size semiconductor package. Although the cut end of each wire 50 may be directly used as an output terminal 70, it may be brazed with a metal ball or a lead having various shapes in order to achieve an easy and reliable mounting of the semiconductor package to a mother board.

Figure 10A:
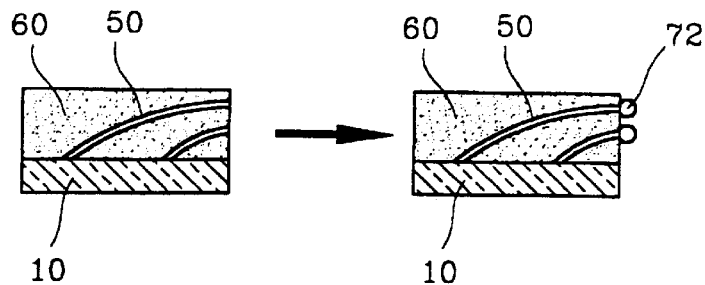
FIG. 10A is a cross-sectional view schematically illustrating a processing step for forming metal balls as external output terminals, which is used in the fabrication method of the present invention.

Referring to FIG. 10A, a processing step for forming metal balls as external output terminals is illustrated which is used in the fabrication method of the present invention. The metal balls, which are denoted by the reference numerals 72 in FIG. 10A, can be formed in accordance with a reflow process using a rosin flux, a metal paste process, or a metal plating/melting process.

In accordance with the reflow process using a rosin flux, the cut end of each wire 50 is coated with a rosin flux. Thereafter, a metal ball 72 is seated on the flux-coated end of the wire 50, and then heated, thereby causing it to be melted in a reflowable state. In this state, the melted metal ball 72 is cooled. As the cooling proceeds, the melted metal ball 72 forms a spherical shape while being solidified. Thus, the metal ball 72 is brazed to the end of the wire 50.

On the other hand, in accordance with the metal paste process, the cut end of each wire 50 is coated with a paste of metal powder. Thereafter, the coated paste is heated to volatile the solvent component of the paste while melting the metal powder component of the paste. The melted metal is then cooled. As the cooling proceeds, the melted metal forms a spherical shape while being solidified. Thus, a metal ball 72 is brazed to the end of the wire 50.

In accordance with the metal plating/melting method, a metal film is plated on the cut end of each wire 50, and then heated, thereby causing it to be melted. The melted metal film is then cooled. As the cooling proceeds, the melted metal film forms a spherical shape while being solidified. Accordingly, a metal ball 72 is brazed to the end of the wire 50.

Preferably, the metal balls 72 are made of a solder containing lead and tin as a principal component thereof. However, the metal balls 72 are not limited to this material. Gold, silver, or an alloy thereof may be used for the material of the metal balls 72. Such a material of the metal balls 72 has a property of keeping a spherical or hemispherical shape when being slowly cooled after being melted. Accordingly, it is unnecessary to conduct any post processing.

Figure 10B:
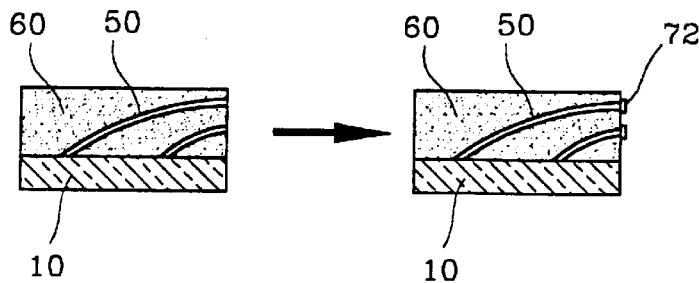
FIG. 10B is a cross-sectional view schematically illustrating a processing step for forming leads as external output terminals, which is used in the fabrication method of the present invention.

Referring to FIG. 10B, a processing step for forming leads as external output terminals is illustrated which is used in the fabrication method of the present invention. As shown in FIG. 10B, leads 72 having various shapes may be attached to the exposed cut ends of the wires 50 using an adhesive means such as a conductive adhesive.

Figure 10C:
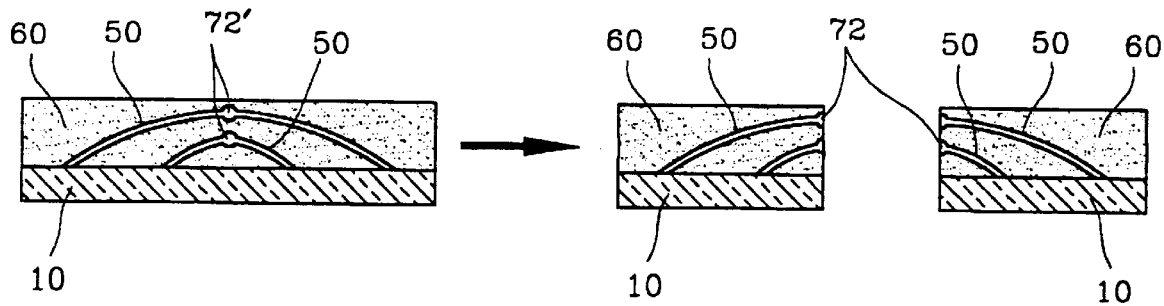
FIG. 10C is a cross-sectional view illustrating a processing step for directly forming output terminals using a singulation process in accordance with an embodiment of the present invention.

FIG. 10C is a cross-sectional view illustrating a processing step for directly forming output terminals using a singulation process in accordance with an embodiment of the present invention. In this embodiment, each wire 50 is partially melted at an accurately central portion thereof, when viewed in the longitudinal direction of the wire 50, by applying high voltage to an end of the capillary (denoted by the reference numeral 52 in FIGS. 7 and 8) for an instant, thereby forming a ball 72'. This ball 72' is cut along its center line during the singulation step. The cut surfaces of the ball 72' having a relatively large area correspond to respective other-side ends of wires in adjacent semiconductor packages, as mentioned above in conjunction with FIGS. 2 to 4. That is, these cut surfaces of the ball 72' serve as external output terminals 72, respectively. Accordingly, it is unnecessary to conduct any processing step for forming separate external output terminals. This results in an improvement in process efficiency.

Figure 11:
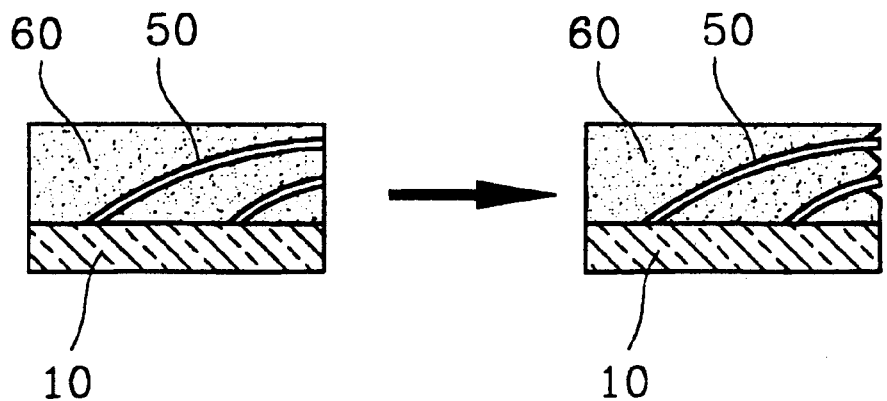
FIG. 11 is a cross-sectional view illustrating a pre-processing step selectively conducted prior to the formation of metal balls as output terminals in accordance with the fabrication method of the present invention.

FIG. 11 is a cross-sectional view illustrating a pre-processing step selectively conducted prior to the formation of metal balls as output terminals in accordance with the fabrication method of the present invention. In this pre-processing step, each encapsulate 60 is partially removed at a surface portion thereof arranged adjacent to the exposed cut end of each wire 50 using a laser beam, prior to the brazing of the metal balls 72. In this case, it is possible to achieve an easier formation of the metal balls 72 as output terminals.

There is a possibility for the exposed cut end of each wire 50 to be slightly damaged due to a shear stress generated during the singulation step. To this end, each encapsulate 60 is partially removed at its surface portion arranged adjacent to the exposed cut end of each wire 50 using a laser beam. Accordingly, it is possible to reliably and easily achieve the attachment of the metal balls 72, the coating of the metal paste, or the metal plating. In particular, the contact area between the cut end of each wire 50 and the metal ball 72 increases because the cut end of the wire 50 is in a protruded state. This results in a firm brazing of the metal ball 72.

Figure 12:
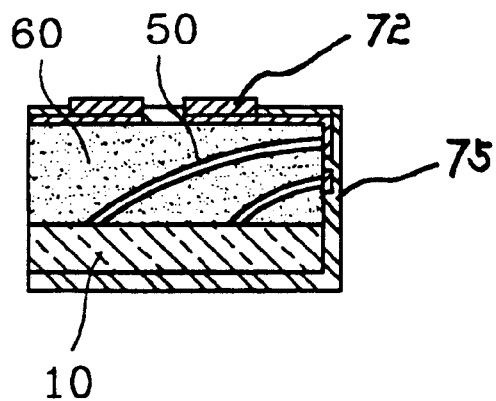
FIG. 12 is a cross-sectional view illustrating a socket adapted to provide external output terminals for the chip size semiconductor package according to the present invention.

FIG. 12 is a cross-sectional view illustrating a socket adapted to provide external output terminals for the chip size semiconductor package according to the present invention. As shown in FIG. 12, the socket, which is denoted by the reference numeral 75, is fitted around one side portion of the chip size semiconductor package where the cut ends of the wires 50 are exposed. The socket 75 is provided with a plurality of terminals serving as the external output terminals 72. When the socket 75 is appropriately fitted around the chip size semiconductor package, the terminals, namely, the external output terminals 72, are electrically connected with the cut ends of the wires 50, respectively. The socket 75 may have an optional structure in so far as its external output terminals 72 are electrically connected with the cut ends of the wires 50, respectively.

Preferably, the formation of metal balls or leads 72 as output terminals may be conducted in a simultaneous fashion for all semiconductor packages. In this case, the process is carried out under the condition in which the semiconductor packages are held in a separate receiving frame (not shown). Of course, the formation of metal balls or leas 72 may be conducted for every semiconductor package.

Typically, a marking step is conducted for the chip size semiconductor package fabricated as mentioned above. This marking may be carried out on the lower surface of the wafer 80 or an exposed major surface of the encapsulate 60. Where a desired mark is to be formed on the lower surface of the wafer 80, the marking step may be conducted at an initial wafer loading step prior to the wire bonding step. In this case, it is also possible to conduct the marking step after the encapsulate molding step, but before the singulation step. Where a desired mark is to be formed on the exposed major surface of the encapsulate 60, the marking step is preferably conducted after the encapsulate molding step, but before the singulation step. In either case, the marking step is carried out by wafers. Accordingly, the entire portion of the wafer is simultaneously and easily marked.

Simultaneously with this marking, a cutting line identification marking may be conducted at a cross region where four semiconductor package units adjoin together. In this case, it is possible to achieve an easier cutting process involved in the singulation step by virtue of identification marks formed by the cutting line identification marking. For this cutting line identification marking, an ink marking process using ink or a laser marking process using a laser beam may be used.

Where a mark, indicative of the quality of each semiconductor chip, the wire bonding quality, or the grade, is formed at the marking step, it is possible to easily sort semiconductor packages of a poor quality after the fabrication of those semiconductor packages.

Typically, wafers are supplied to the manufacturer of semiconductor packages, along with files respectively associated with the status and information about those wafers including, for example, the positions of semiconductor chip units having a poor quality, intrinsic physical characteristics of the wafer, the number of semiconductor chips included in the wafer, the quality of each semiconductor chip, and the name of the manufacturer. Where a marking machine used is stored with such information, it is possible to easily indicate the quality of each semiconductor chip and/or each semiconductor package, and/or the grade thereof by the marking machine.

The wire bonding machine used may have functions of checking the wire bonding quality and supplying the checked results to the marking machine. In this case, the marking machine serves to collect information about the quality of the wafer and/or the grade, and information of the wire bonding quality, thereby indicating marks indicative of the quality and/or the grade.

As apparent from the above description, the present invention provides a chip size semiconductor package having a simple, multipinned and thin structure capable of having a chip size. The present invention also provides a method capable of fabricating the chip size semiconductor package having such an improved structure using simplified processes while reducing the costs.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor package comprising:
    a semiconductor chip having first surface with a conductive pad thereon;
    a bond wire having a first end and an opposite second end, wherein the first end of the bond wire is bonded to the pad; and
    an encapsulant, wherein said encapsulant covers the first surface of the chip and the bond wire and forms one or more exterior side surfaces of the package; and
    wherein the second end of the wire is exposed in a plane of one of the exterior side surfaces of the package, said exterior side surface being perpendicular to the first surface of the semiconductor chip and flush with a peripheral side surface of the semiconductor chip.

2. The package of claim 1, further comprising a plurality of said conductive pads on the first surface of the chip;
    a plurality of said bond wires each having a first end bonded to a pad and a second end; and
    a plurality of said side surfaces, wherein the second end of each of the plurality of bond wires is exposed in the plane of a respective one of the exterior side surfaces of the package.

3. The package of claim 2, further comprising a plurality of conductors, wherein each conductor is connected to the exposed second end of the bond wire at the respective exterior side surface of the package.

4. The package of claim 2, further comprising a hole in said side surface of the package around the exposed second end of the wires.

5. The package of claim 2, wherein the second ends of the wires are exposed at the same side surface of the package.

6. The package of claim 2, further comprising a socket having a cavity with a plurality of first conductors within the cavity, wherein said package is within said cavity and the second end of each of the wires is electrically connected to a first conductor within the cavity.

7. The package of claim 2, wherein the exposed second end of the bond wire has a hemispherical ball shape.

8. The package of claim 2, wherein the pads are arranged in a single line, and the exposed second ends of the bond wires are arranged in a single line at the same side surface of the package.

9. The package of claim 2, wherein the pads are arranged in a single line, and the exposed second ends of the bond wires are at a plurality of levels at the same side surface of the package.

10. The package of claim 2, wherein the pads are arranged in parallel first and second lines;
    the exposed second ends of bond wires that are electrically connected to pads of the first line are arranged in a line at a first level at a first of the one or more exterior side surfaces of the package; and
    the exposed second ends of the bond wires that are electrically connected to pads of the second line are arranged in a line at a second level at the first side surface of the package.

11. The package of claim 2, wherein the pads are arranged in parallel first and second lines;
   the exposed second ends of bond wires that are electrically connected to pads of the first line are exposed at a first of the one or more exterior side surfaces of the package; and
   the exposed second ends of the bond wires that are electrically connected to pads of the second line are arranged in a line at a second of the one or more exterior side surfaces of the package.

12. The package of claim 2, wherein the pads are arranged in four lines forming a square or rectangular shape, wherein each line of pads is adjacent to a different one of the exterior side surfaces of the package, and the exposed second ends of the bond wires electrically connected to each of the four lines of pads are exposed at the side surface of the package adjacent to the respective line of pads.

13. The package of claim 3, wherein the conductors comprise metal balls or metal leads.

14. The package of claim 6, further comprising an outer second surface on said socket and a plurality of second conductors on said second surface, wherein each of the first conductors is electrically connected to a second conductor.

15. The package of claim 11, wherein the first side surface is opposite the second side surface, and the exposed second ends of the bond wires at the first and second side surfaces are at a plurality of levels.

16. A semiconductor package assembly comprising:
   a semiconductor wafer including a plurality of semiconductor chip units each having a plurality of conductive pads at a first surface of the wafer;
   a plurality of bond wires each electrically connected between one said pad of one of the semiconductor chip units and one said pad of an adjacent one of the semiconductor chip units; and
   an encapsulant on the first surface of the semiconductor wafer completely covering the bond wires and the pads of the semiconductor chip units.

17. The package assembly of claim 16, wherein a first bond wire of each of the semiconductor chip units is electrically connected to a pad of a first adjacent semiconductor chip, and a second bond wire of the respective semiconductor chip unit is electrically connected to a bond pad of a second adjacent semiconductor chip unit.

18. The package assembly of claim 16, further comprising a ball formed at a central portion of each of the bond wires.

19. A semiconductor package comprising:
   a semiconductor chip having first surface with a plurality of conductive pads thereon,
   a plurality of bond wires each having a first end and an opposite second end, wherein the first end of a bond wire is bonded to a respective one of the pads; and
   an encapsulant, wherein said encapsulant covers the first surface of the chip and the bond wires and forms one or more exterior side surfaces of the package,
   wherein the second end of each of the wires is exposed at one of the side surfaces of the package, said side surface of the package including a hole around the exposed second end of the respective wires.

20. A semiconductor package comprising:
   a semiconductor chip having first surface with a plurality of conductive pads thereon,
   a plurality of bond wires each having a first end and an opposite second end, wherein the first end of a bond wire is bonded to a respective one of the pads; and
   an encapsulant, wherein said encapsulant covers the first surface of the chip and the bond wires and forms one or more exterior side surfaces of the package, wherein the second end of each of the wires is exposed at one of the side surfaces of the package; and
   a socket having a cavity with a plurality of first conductors within the cavity, wherein said package is within said cavity and the second end of each of the wires is electrically connected to one of the first conductors within the cavity.

21. The package of claim 20, further comprising:
   an outer second surface on said socket and a plurality of second conductors on said second surface, wherein each of the first conductors is electrically connected to one of the second conductors.

22. A semiconductor package comprising:
   a semiconductor chip having first surface with a plurality of conductive pads thereon, wherein the pads arranged in parallel first and second lines;
   a plurality of bond wires each having a first end and an opposite second end, wherein the first end of each bond wire is bonded to a respective one of the pads;
   an encapsulant, wherein said encapsulant covers the first surface of the chip and the bond wires and forms one or more exterior side surfaces of the package,
   wherein the exposed second end of the bond wires that are electrically connected to pads of the first line are arranged in a line at a first level at a first one of the side surfaces of the package, and the exposed second end of the bond wires that are electrically connected to pads of the second line are arranged in a line at a second level at the first one of the side surfaces of the package.

23. A semiconductor package comprising:
   a semiconductor chip having first surface with a plurality of conductive pads thereon, wherein the pads arranged in parallel first and second lines;
   a plurality of bond wires each having a first end and an opposite second end, wherein the first end of each bond wire is bonded to a respective one of the pads;
   an encapsulant, wherein said encapsulant covers the first surface of the chip and the bond wires and forms one or more exterior side surfaces of the package,
   wherein the exposed second end of the bond wires that are electrically connected to pads of the first line are exposed at a first one of the side surfaces of the package, and the exposed second end of the bond wires that are electrically connected to pads of the second line are arranged in a line at a second one of the side surfaces of the package.

24. The package of claim 23, wherein the first side surface is opposite the second side surface, and the exposed second end of the bond wires at the first and second side surfaces are at a plurality of levels.

25. A semiconductor package assembly comprising:
   a wafer including a plurality of semiconductor chip units each having a plurality of conductive pads at a first surface of the wafer;
   a plurality of bond wires each electrically connected between one of the pads of one of the semiconductor chip units and one of the pads of an adjacent semiconductor chip unit, and further comprising a ball formed at a central portion of each of the bond wires; and
   an encapsulant on the first surface of the wafer completely covering the bond wires and the pads of the semiconductor chip units.

* * * * *